United States Patent [19]
Bergman et al.

[11] Patent Number: 6,154,021
[45] Date of Patent: Nov. 28, 2000

[54] METHOD AND ARRANGEMENT FOR DETECTING PHASE DIFFERENCE

[75] Inventors: Johan Bergman, Göteborg, Sweden; Thorsten Kraus, Billigheim, Germany

[73] Assignee: Telefonaktiebolaget LM Ericsson (publ), Stockholm, Sweden

[21] Appl. No.: 09/218,625

[22] Filed: Dec. 22, 1998

[30] Foreign Application Priority Data

Dec. 23, 1997 [SE] Sweden ................................ 9704860

[51] Int. Cl.⁷ .................................................. G06G 7/19
[52] U.S. Cl. .................................... 324/76.22; 324/76.72
[58] Field of Search ................... 702/71, 72; 324/76.72, 324/76.23, 76.52, 76.74, 76.77, 76.82, 76.63, 639

[56] References Cited

U.S. PATENT DOCUMENTS

| | | | |
|---|---|---|---|
| 3,805,153 | 4/1974 | Gallant . | |
| 3,854,117 | 12/1974 | Fothergill | 367/125 |
| 3,961,172 | 6/1976 | Hutcheon | 235/181 |
| 4,001,682 | 1/1977 | Watt . | |
| 4,075,555 | 2/1978 | Wigh et al. | 324/644 |
| 4,219,770 | 8/1980 | Weinert | 324/647 |
| 4,419,624 | 12/1983 | Brown | 324/76.82 |
| 4,477,773 | 10/1984 | Margerum | 324/76.41 |
| 4,520,321 | 5/1985 | Nakatsugawa et al. . | |
| 4,600,994 | 7/1986 | Hayashi . | |
| 4,721,904 | 1/1988 | Ozaki et al. | 324/76.77 |
| 4,728,884 | 3/1988 | Gumm . | |
| 5,006,800 | 4/1991 | Hedengren et al. | 324/233 |
| 5,165,051 | 11/1992 | Kumar | 324/76.47 |
| 5,438,254 | 8/1995 | Ho et al. | 324/76.82 |
| 5,495,100 | 2/1996 | Takeshima | 250/214 R |
| 5,552,750 | 9/1996 | Barrett, Jr. et al. . | |
| 5,637,999 | 6/1997 | Hennecken | 324/212 |
| 5,852,794 | 12/1998 | Staggs | 702/72 |

FOREIGN PATENT DOCUMENTS

| | | |
|---|---|---|
| 0 256 637 | 2/1988 | European Pat. Off. . |
| 0 379 321 | 7/1990 | European Pat. Off. . |
| 1 507 323 | 4/1978 | Germany . |

*Primary Examiner*—Safet Metjahic
*Assistant Examiner*—Vincent Q. Nguyen
*Attorney, Agent, or Firm*—Burns, Doane, Swecker & Mathis, L.L.P.

[57] ABSTRACT

The difference in phase between a first and a second electrical signal at substantially the same frequency is detected in an interval of 360°. Both the first and the second signals are used as input signals to a first and a second device unambiguous detection of phase differences in an interval of 180°, and one input signal to the first detection device is phase-shifted ninety degrees. The output signal from the first phase detection device is used in order to indicate whether the output signal from the second phase detection device corresponds to a phase difference that is greater or smaller than 180°. Also, the output signal from the second phase device is used in order to produce, with the aid of the output signal from the first phase detection device, an output signal that indicates unambiguously, in an interval of 360°, the value of the phase difference between the first and the second input signal.

9 Claims, 6 Drawing Sheets

METHOD AND ARRANGEMENT FOR DETECTING PHASE DIFFERENCE

TECHNICAL WIELD

The present invention relates to a method and an arrangement for unambiguous detection of the phase difference between two electrical signals in an interval, with the aid of two arrangements which provide ambiguous detection of phase differences in the interval.

BACKGROUND

Detection of the difference in phase between two electrical signals is a function that is of interest in a great many fields within electrical engineering. Radio, television, radar and mobile telephony may be mentioned among the many possible areas of application of detection of phase difference.

As detection of phase difference, also known as phase detection, has such a great many areas of application, there is a great interest in developing methods and arrangements that make possible inexpensive, operationally reliable and unambiguous phase detection. A problem in this respect is that the frequency ranges in which it is desirable to use phase detectors are increasing constantly. It is of course highly desirable, in higher frequency ranges also, to be able to carry out unambiguous phase detection within an angular interval of 360°. At present, however, there are few phase detectors that, within higher frequency ranges and above all the microwave range, satisfy the abovementioned requirement for inexpensive, operationally reliable and unambiguous phase detection within a full angular interval of 360°; most phase detectors allow unambiguous phase detection only within an angular interval of 180°.

Among known methods and arrangements for solving the abovementioned problems concerning phase detection, mention may be made of those that are described in EP 379 321, EP 256 637 and U.S. Pat. No. 5,552,750.

However, all these documents disclose solutions that are based on digital technology, which may be said to provide expensive and complex solutions.

SUMMARY

The problem that is solved with the aid of the present invention is that of obtaining a method and an arrangement for unambiguous detection within an interval of 360° of the difference in phase between a first and a second electrical signal, which signals are at essentially the same frequency, preferably a frequency higher than 1 GHz.

This problem is solved with the aid of a method and an arrangement comprising a first and a second phase detector, which detectors can both detect unambiguously, within an interval of 180°, phase differences between a first and a second electrical signal.

According to the invention, both the first and the second signal, between which the phase difference is to be detected, are used as input signals to both the first and the second phase detector, one of the input signals being phase-shifted 90° before it is used as an input signal to the phase detector. As the first and the second input signals are in other respects the same, and the first and the second phase detector are the same, the result is in other words that the difference in output signal from the first and the second phase detector corresponds to a phase shift of 90°.

The difference between the output signals of the phase detectors is utilized in such a manner that the output signal from the first phase detector is used in order to indicate whether the output signal from the second phase detector corresponds to a phase difference that lies within or outside an interval of 180°, preferably the interval 0°–180°. With the aid of this information from the first phase detector, the output signal from the second phase detector is used in order to produce an output signal that indicates unambiguously, in an interval of 360°, preferably the interval 0°–360°, the value of the phase difference between the first and the second input signal.

This unambiguous output signal is produced by virtue of the output signal from the second phase detector being amplified in two parallel stages, one inverting and one non-inverting. Offset signals are added to these amplified signals, and the output signal from the first phase detector is used for controlling which of the two parallel signals is to be used in order to indicate the phase difference between the first and the second input signal.

BRIEF DESCRIPTION OF THE DRAWINGS

The invention will be described in greater detail below with the aid of an example of a preferred embodiment and with reference to the appended drawings, in which.

DETAILED DESCRIPTION

Figure 1:
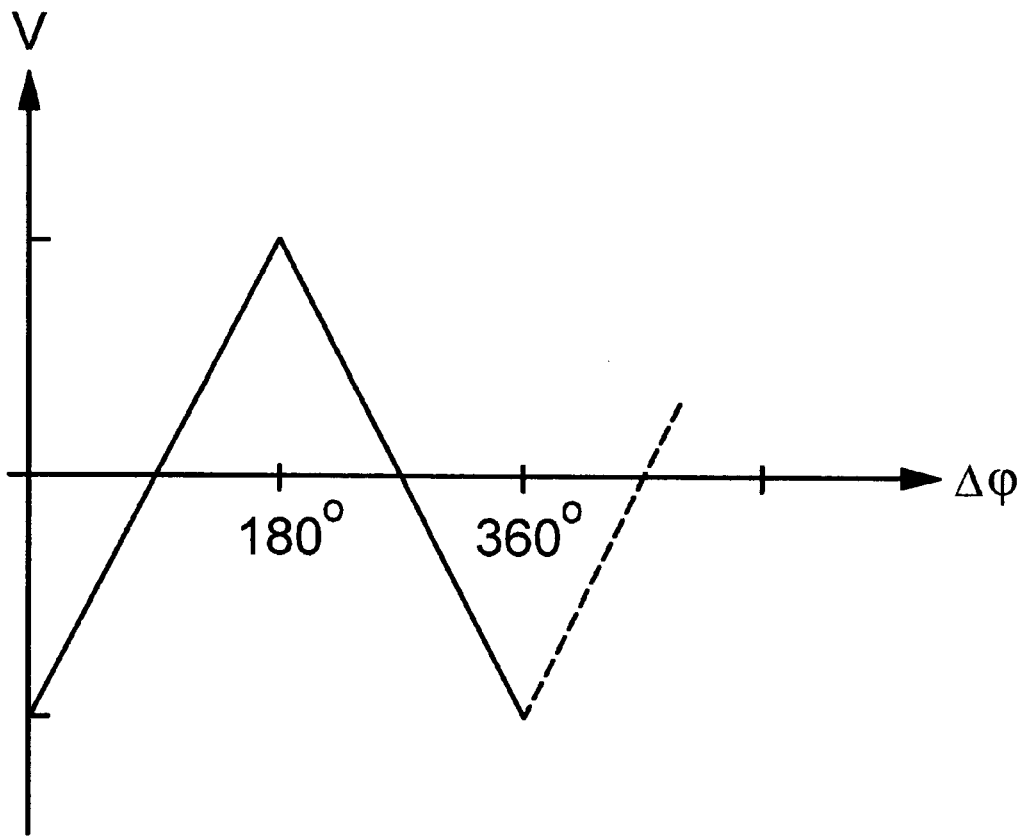
FIG. 1 shows diagrammatically the phase/voltage curve of a phase detector that is used according to the invention.

FIG. 1 shows diagrammatically the phase/voltage curve of a phase detector that is used according to the invention. This phase detector is preferably a mixer, but may also be embodied in other ways well-known to the person skilled in the art. As can be seen from FIG. 1, this type of phase detector provides unambiguous phase detection only within an interval of 180°; in an interval of 360°, two different phase differences can give one and the same output signal $V_1$.

As far as the phase detectors that are used according to the invention are concerned, it is to be pointed out that, as mentioned, they can detect phase differences unambiguously only within an interval of 180°, but this interval may of course be an arbitrary interval of 180°. Above, and below, the interval 0°–180° has been selected, which is the interval that is used in a preferred embodiment of the invention.

More generally it can, in other words, be said that each phase detector forming part of the invention can detect unambiguously whether the phase difference between two input signals lies within or outside a given interval of 180°.

In the same way, it can be said that the invention provides unambiguous phase detection within an arbitrarily selected interval of 360° but, in the rest of the description, the interval 0°–360° will be used for the sake of simplicity so as to facilitate the understanding of the invention.

Figure 2:
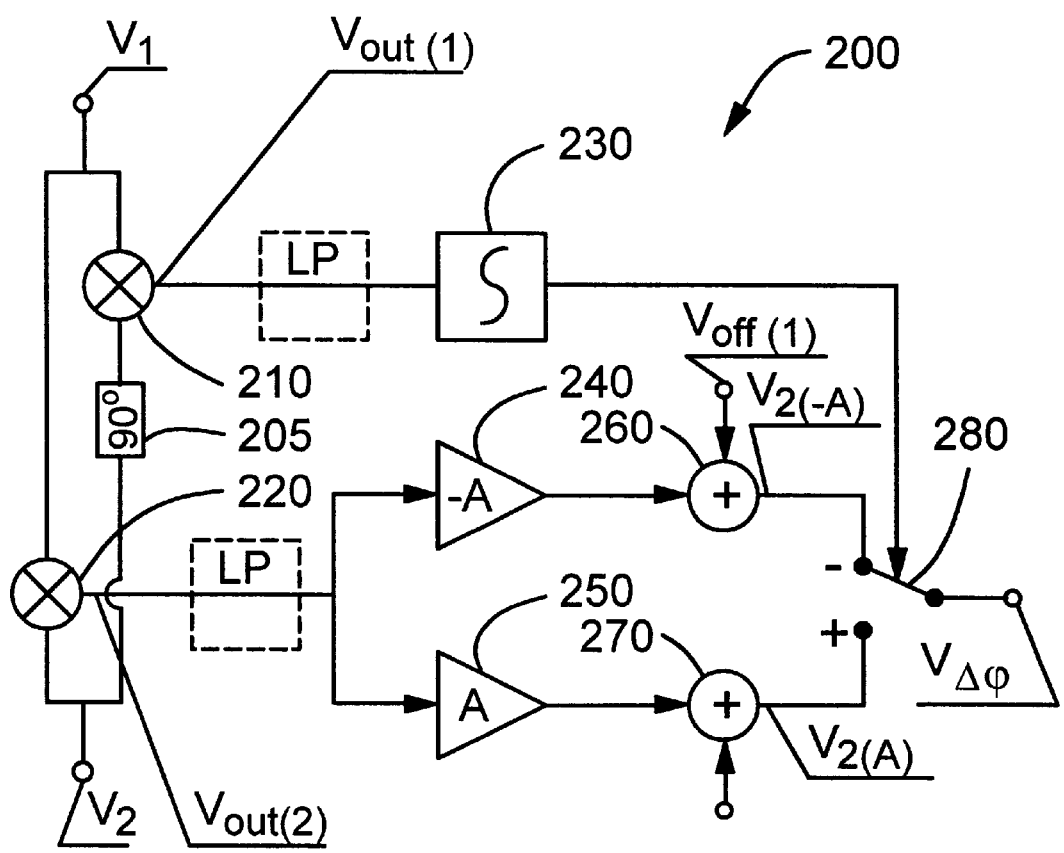
FIG. 2 shows a block diagram of a preferred embodiment of an arrangement according to the invention.

FIG. 2 shows an arrangement 200 according to the invention. The arrangement includes two phase detectors 210, 220 with the phase/voltage curve that is shown in FIG. 1, a circuit 205 for phase shifting, a circuit 230 for sign detection, two amplifier circuits 240, 250, two summation circuits 260, 270, and also a switchable output 280.

As can be seen from FIG. 2, there are two input signals $V_1$ and $V_2$ to the arrangement 200, which are signals that have essentially the same frequency but not necessarily the same phase. A task for the arrangement 200 is to detect unambiguously, within the interval 0°–360°, the phase difference $\Delta f$ between the input signals $V_1$ and $V_2$.

Both $V_1$ and $V_2$ are used as input signals to the first 210 and the second 220 phase detector but $V_2$ is phase-shifted 90° before it is used as an input signal to the first phase detector 210. The output signals, $V_{out}(1)$ and $V_{out}(2)$, from the first 210 and the second 220 phase detector will therefore have values that are shifted corresponding to this phase difference. This is illustrated diagrammatically in FIG. 3. As also emerges from FIG. 3, the output signal $V_{out}(1)$ from the first phase detector 210 will be negative when the output signal $V_{out}(2)$ from the second phase detector 220 corresponds to a phase difference that is smaller than 180° and positive when $V_{out}(2)$ corresponds to a phase difference that is greater than 180° but smaller than 360°.

Figure 3:
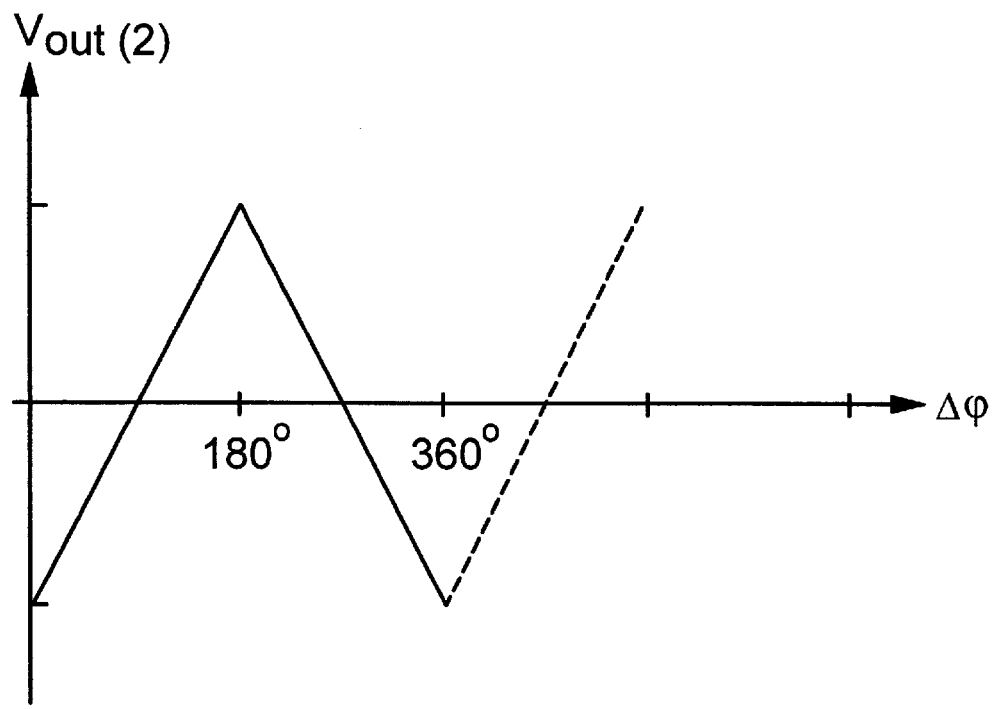
FIG. 3 shows the output signals from the two phase detectors that are used in the arrangement in FIG. 2.
Figure 3:
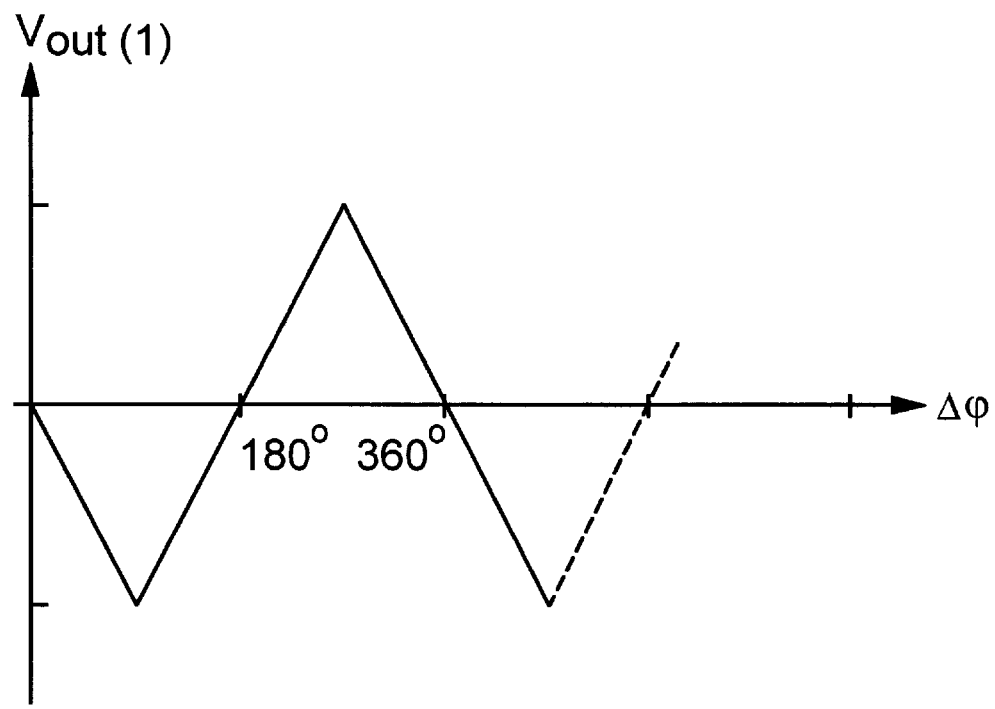

As also emerges from FIG. 3, the output signals $V_{out}(1)$ and $V_{out}(2)$ from the first 210 and the second 220 phase detector vary between a maximum and a minimum amplitude, P and –P. In this description, it is assumed for the sake of clarity that both the phase detectors 210, 220 have the same maximum positive and negative amplitude in terms of absolute value, which of course does not have to be the case. If the phase detectors do not have the same maximum and minimum amplitude respectively, this may be compensated for, for example, with the aid of the amplification arrangements 240, 250.

The output signal $V_{out}(1)$ from the first phase detector 210 can therefore be used in order to indicate whether the output signal $V_{out}(2)$ from the second phase detector 220 corresponds to a phase difference that is greater or smaller than 180°. According to the invention, this is effected by virtue of the output signal from the first phase detector 210 being connected to a circuit 230 for sign detection, the operation of which is shown diagrammatically in FIG. 4.

Figure 4:
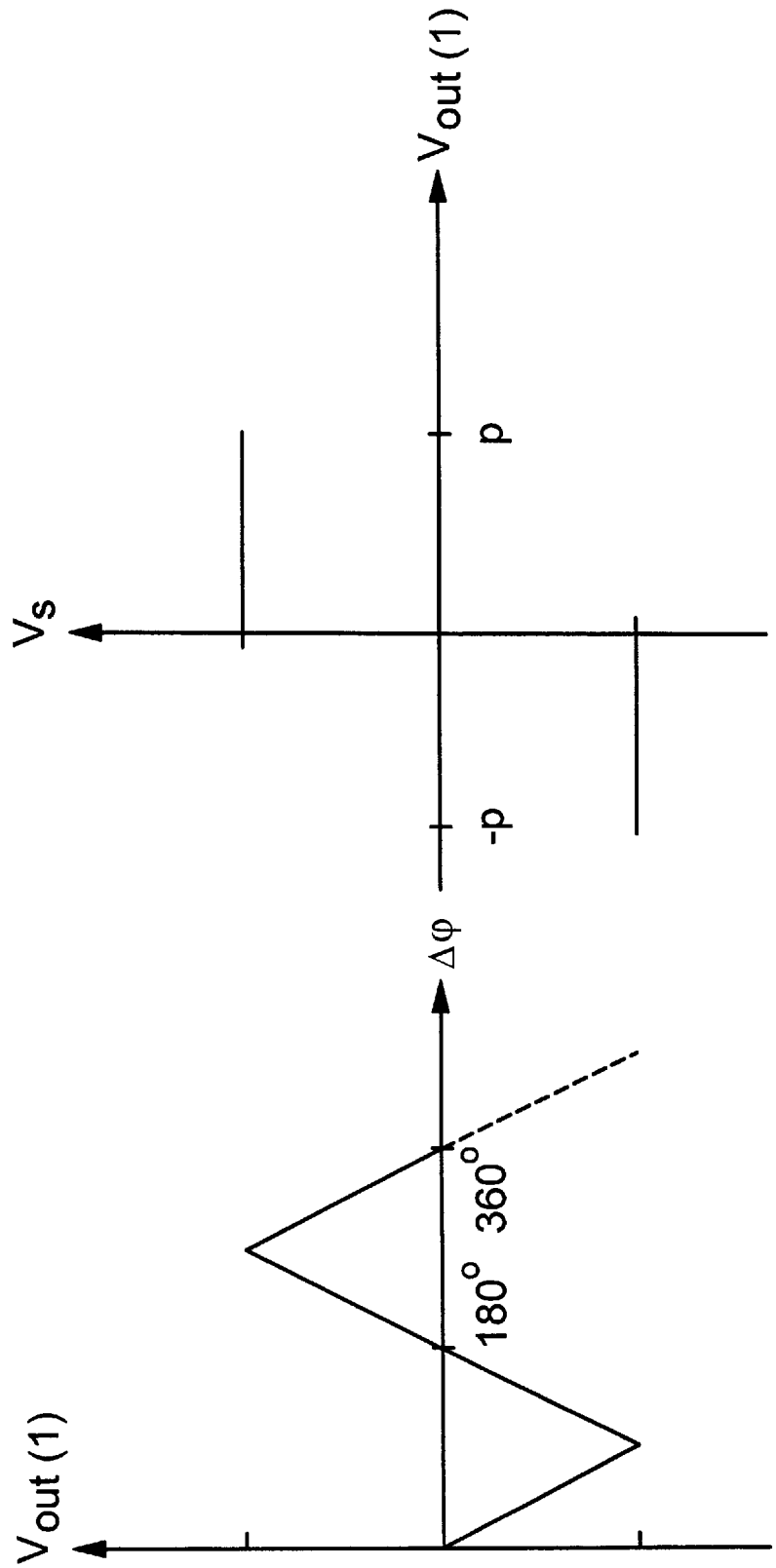
FIG. 4 shows the signals $V_s$ and $V_{out}$ (1) in the block diagram in FIG. 2.

The output signal $V_s$ from the sign detector 230 is constant and negative if the output signal $V_{out}(1)$ from the first phase detector 210 is negative, and constant and positive if $V_{out}(1)$ is positive. This can be brought about by means of, for example, a Schmitt-trigger, in other words an operational amplifier connected so as to provide the operation that is shown in FIG. 4. How the output signal $V_s$ from the sign detector 230 is used will be described in greater detail below.

With reference once again to the arrangement 200 that is shown in FIG. 2, it can be seen that the output signal $V_{out}(2)$ from the second phase detector 220 is divided into a first and a second branch and is amplified, the signal in the first branch also being inverted. The value A of the amplification, unlike the sign, is not of crucial importance to the invention, but should be essentially the same in the two branches. In the rest of the description, it will be assumed for the sake of simplicity that the amplification factor is equal to one, the signals in the two branches then keeping their maximum amplitude P and –P.

After amplification 240, 250, an offset signal $V_{off}(1)$ and $V_{off}(2)$ respectively is added to the signals in the branches. These offset signals, $V_{off}(1)$, $V_{off}(2)$, should not be the same in the two branches.

If, for the sake of simplicity, the output signal $V_{\Delta\phi}$ is to be zero when the phase difference is equal to zero, and the output signal $V_{\Delta\phi}$ is furthermore to be positive for increasing phase difference, the offset signals should be selected in the following way: the offset signal $V_{off}(1)$ that is added to the signal in the first branch, in other words the inverted signal, should suitably correspond to 3 times the maximum value P of the signal, and the offset signal $V_{off}(2)$ that is added to the signal in the second branch should correspond to the maximum value P of the signal.

Figure 5:
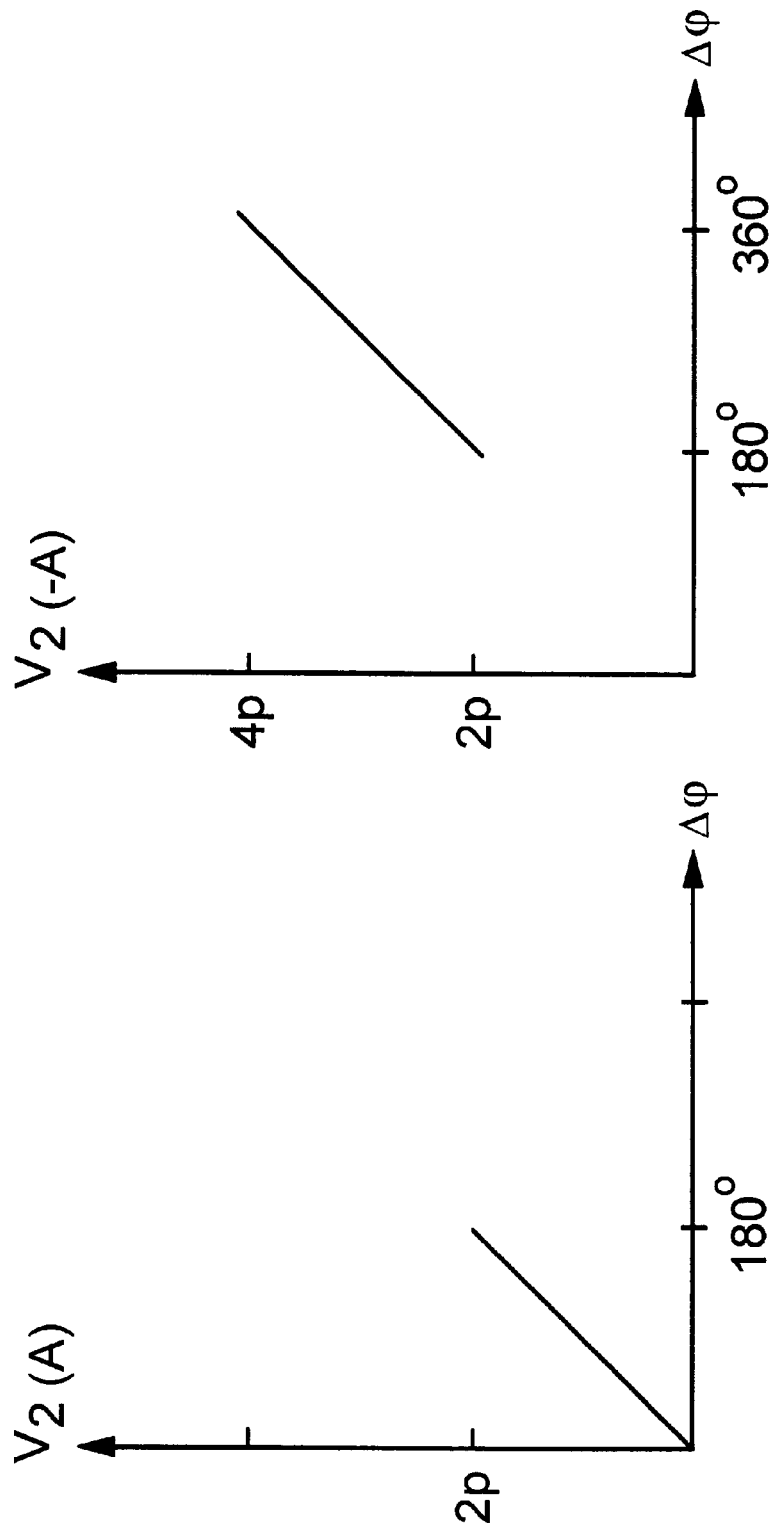
FIG. 5 shows output signals in a given section in the arrangement in FIG. 2.

After addition, the output signals $V_2(A)$ and $V_2(-A)$ respectively are obtained from the branches as shown in FIG. 5.

Figure 6:
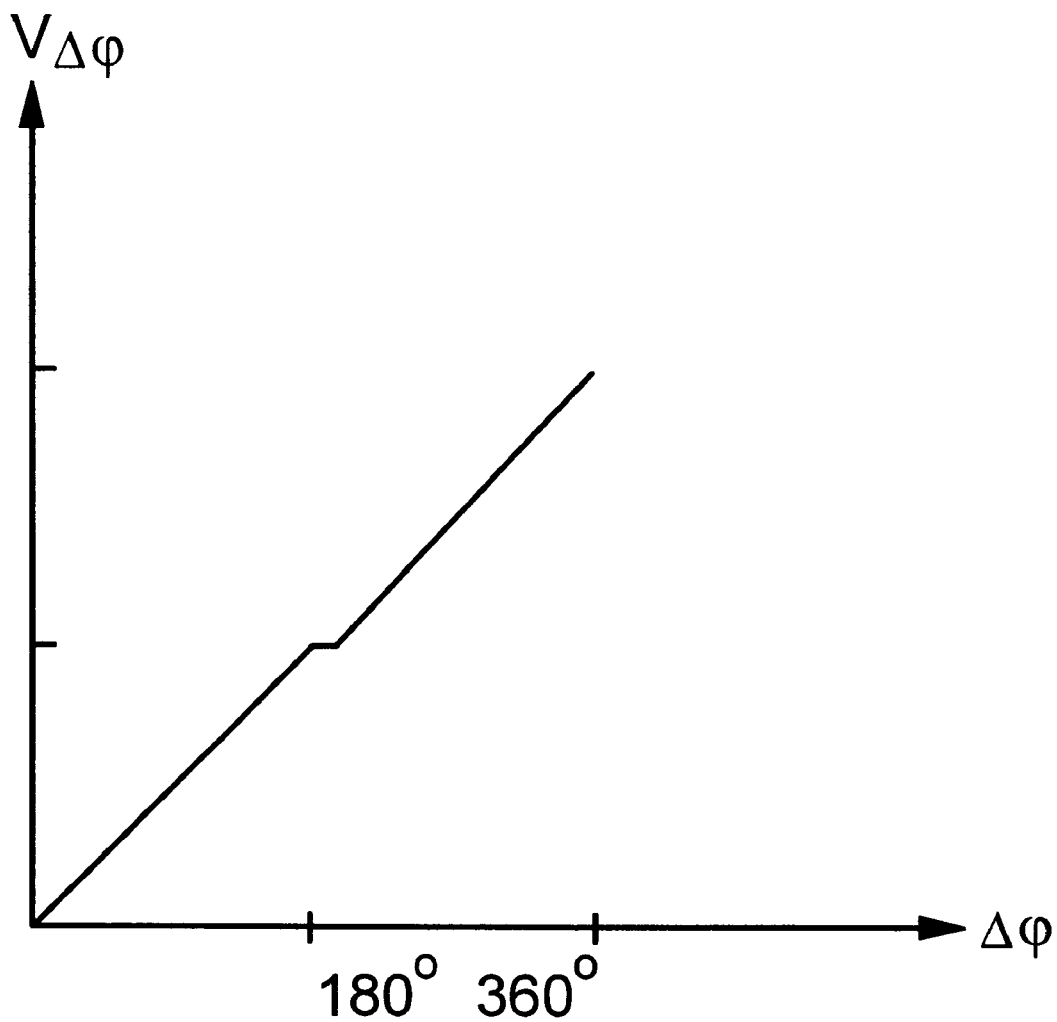
FIG. 6 shows the output signal that is obtained from the arrangement in FIG. 2.

In order finally to produce a signal $V_{\Delta\phi}$ that indicates unambiguously, in the interval 0°–360°, the difference in phase between the two input signals $V_1$, $V_2$ the signal $V_s$ from the sign detector 230 is used in order to control which of the signals $V_2(A)$, $V_2(-A)$ from the two branches is to be used as the output signal $V_{\Delta\phi}$ from the arrangement 200. If $V_s$ is negative, the non-inverted signal $V_2(A)$ is used and, if $V_s$ is positive, the inverted signal $V_2(-A)$ is used. The final output signal $V_{\Delta\phi}$ from the arrangement 200 then has the phase/voltage curve that is shown in FIG. 6. How switching between $V_2(-A)$ and $V_2(A)$ as the output signal takes place will not be described in greater detail here as it is not of essential importance to the invention and may be performed in a great many ways well-known to the person skilled in the art.

By means of the invention, a method and an arrangement for unambiguous phase detection in an interval of 360° with the aid of phase detectors that provide unambiguous detection only in an interval of 180° are therefore obtained. As all the components required according to the invention are analogue, low cost and high operational reliability are achieved. The arrangement can also be used in an, on the whole, arbitrary frequency range.

The phase detectors have been described as mixers above. This is not necessary for the invention, and the phase detectors may be constructed in other ways well-known to the person skilled in the art. If the phase detectors consist of mixers, it may be suitable, however, to arrange low-pass filters, LP, at the outputs of the mixers, in order to remove undesirable mixing components. These low-pass filters, LP, are indicated by dashed lines in FIG. 2.

If the phase detectors consist of mixers, these may suitably be double-balanced mixers, in other words mixers with an output signal that is symmetrical in relation to the input signals to the mixer. Moreover, if the phase detectors consist of mixers, the output signals from the mixers will vary, on the one hand depending on the phase difference between the input signals and on the other hand depending on the amplitudes of the input signals. In order to make the output signals of the phase detectors independent of the amplitude of the input signals, it may be suitable for the input signals to lie at a level at which the output signal of the mixer is not dependent on the amplitude of the input signal, in other words the mixer is saturated.

The invention is not limited to the exemplary embodiment described above but may be varied freely within the scope of the patent claims below. For example, either of the two 15 signals between which the phase difference is to be detected may be phase-shifted 90°.

It is obvious for a person skilled in the art that, by changing the amplification A and the offset signals, it is possible to change the slope and starting point of the output signal. Likewise, by changing the operation of the switch 280 and changing the offset signals, it is possible to give the output signal a negative slope.

Finally, it should once again be pointed out that the interval within which the phase detectors forming part of the invention can detect phase differences is an interval of 180°, which may be selected on the whole arbitrarily, and also that the interval of 360° within which the invention is applied may likewise be selected on the whole arbitrarily.

What is claimed is:

1. Method for unambiguous detection in an interval of 360° of the difference in phase between a first and a second electrical signal at substantially the same frequency, the method comprising:

providing both the first and the second signals as input signals to a first and a second means of unambiguous detection of phase differences in an interval of 180°, wherein one input signal to one of the detection means is phase-shifted ninety degrees, applying the output signal from the first phase detection means to indicate whether the output signal from the second phase detection means corresponds to a phase difference that lies within or outside said interval of 180° by connecting the output signal from the first phase detection means to a circuit for sign detection, and applying the output signal from the second phase detection means in order to produce, with the aid of the output signal from the first phase detection means, an output signal that indicates unambiguously, in an interval of 0°–360°, the value of the phase difference between the first and the second input signals.

2. Method according to claim 1, wherein said interval of 180° is the interval 0°–180°.

3. Method according to claim 1, wherein said interval of 360° is the interval 0°–360°.

4. Method according to claim 1, wherein the creation of said output signal for unambiguous indication of the value of the phase difference comprises dividing the output signal from the second phase detection means into a first and a second branch, and also:

inverting the signal in the first branch, adding an offset signal to each of the signals in said first and second branches, and controlling which of the signals in said first and second branches is to be used as said unambiguous output signal.

5. Method according to claim 4, wherein the signal that has been inverted is used as said unambiguous output signal if the output signal from the second phase detection means corresponds to a phase difference that lies outside said interval of 180°.

6. Method according to claim 4, wherein the values of the offset signals are selected so that the offset signal that is added to the signal in the first branch substantially corresponds to three times the maximum amplitude in this signal after its amplification, and the offset signal that is added to the signal in the second branch substantially corresponds to the maximum amplitude of this signal after its amplification.

7. Arrangement for unambiguous detection in an interval of 360° of the difference in phase between a first and a second electrical signal at substantially the same frequency, the arrangement comprising:

a first and a second phase detector for unambiguous phase detection within an interval of 180°, a 90° phase shifter to which one of the input signals to one of the phase detectors is connected, a controllable output, a sign detector, to which the output signal from the first phase detector is connected, for indicating whether the output signal from the second phase detector corresponds to a phase difference that lies within or outside said interval of 180°, and means for creating, starting from the output signal from the second phase detection means, and using the output signal from the first phase detection means, an output signal that indicates unambiguously, in an interval of 360°, the value of the phase difference between the first and the second input signals.

8. Arrangement according to claim 7, wherein said means for creating an output signal that indicates unambiguously, in an interval of 360°, the value of the phase difference between the first and the second input signals comprises:

means for dividing the output signal from the second phase detector into two branches, means for amplifying the signal in the two branches by the same value but with different signs, means for adding offset signals to the amplified signals in the two branches, and means for controlling which of the signals in said first and second branches that is to be used as said unambiguous output signal.

9. Arrangement according to claim 7, wherein the phase detectors comprise mixers.

* * * * *